United States Patent [19]

Dubois et al.

[11] Patent Number: 4,481,132

[45] Date of Patent: Nov. 6, 1984

[54] HIGH STABILITY CONDUCTIVE POLYACETYLENE MATERIAL AND PROCESS FOR THE PRODUCTION THEREOF

[75] Inventors: Jean C. Dubois; Maryse Gazard; François Schue; Louis Giral; Michel Rolland; Mahmoud Aldissi, all of Paris, France

[73] Assignee: Thomson-CSF, Paris, France

[21] Appl. No.: 395,294

[22] Filed: Jul. 6, 1982

[30] Foreign Application Priority Data

Jul. 3, 1981 [FR] France ............................. 81 13157

[51] Int. Cl.³ ................................................ H01B 1/06
[52] U.S. Cl. ................................. 252/519; 252/520; 252/521; 524/403; 524/435; 524/406; 524/413; 528/485; 528/490
[58] Field of Search ............... 252/513, 515, 519, 518, 252/520, 521; 526/285; 528/485, 490; 524/403, 413, 435, 406

[56] References Cited

U.S. PATENT DOCUMENTS

| | | | |
|---|---|---|---|
| 4,204,216 | 5/1980 | Heeger et al. | 252/500 |
| 4,222,903 | 9/1980 | Heeger et al. | 252/500 |
| 4,269,738 | 5/1981 | Pez | 252/500 |
| 4,394,304 | 7/1983 | Wrek | 252/512 |

*Primary Examiner*—Josephine L. Barr
*Attorney, Agent, or Firm*—Oblon, Fisher, Spivak, McClelland & Maier

[57] ABSTRACT

The invention relates to a doped polyacetylene film for forming an organic semiconductor or even a conductor of a metallic type. It serves to make the doping more homogeneous and improves the stability over a period of time. The process consists of using as the dopant a salt of an element such as chrome, nickel, iron, titanium, tungsten, or molybdenum belonging to the transition metals, or a salt of an element such as europium or ytterbium belonging to the lanthanides. Doping takes place by immersing the film in a solution having a low dopant concentration, e.g. in toluene, and maintaining the system at low pressure and ordinary temperature for a period of a few days, as a function of the desired doping level and conductivity.

8 Claims, 3 Drawing Figures

HIGH STABILITY CONDUCTIVE POLYACETYLENE MATERIAL AND PROCESS FOR THE PRODUCTION THEREOF

BACKGROUND OF THE INVENTION

1. Field of the Invention

The present invention relates to polyacetylene material made conductive by incorporating a doping agent, and more particularly in the form a mechanically strong, flexible film. This invention also covers the process for producing and doping the same.

2. Description of the Prior Art

European Patent Application published under No. 0,026,234 on Oct. 16, 1980 describes a process for the production of a material, whose microcrystalline fibre-containing structure is very suitable for the production of such films. This material comprises polyacetylene with a high degree of polymerization and at least one electron-accepting doping agent, such as nitric or sulphuric acid or a mixture of strong acids or $SO_3$ oxide, a boron bromide or chloride, or finally a naphthoquinone of optionally substituted by hydrogen, halogen or a cyano, nitro, alkyl or alkoxy radical. In this way, a material is obtained, whose conductivity can vary between $10^{-9}$ and $10^3$ ohm$^{-1}$·cm$^{-1}$ which when formed into a film, has an acceptable mechanical behaviour and flexibility characteristics. However, the thus obtained conductivity is not uniform throughout the thickness of the material and also disappears rapidly over a period of time.

BRIEF SUMMARY OF THE INVENTION

The present invention aims at obviating these disadvantages by replacing conventional dopants by dopants based on heavy elements with low diffusion coefficients.

The material according to the invention which has a high thermal stability and stability to oxygen, is composed of polyacetylene and dopants constituted by a salt of an element belonging either to the transition metal or to the lanthanides.

According to other features, the transition metals are chrome, nickel, iron, titanium, tungsten and molybdenum used in chloride form, whilst the lanthanides are europium and ytterbium.

BRIEF DESCRIPTION OF THE DRAWINGS

The invention will be better understood as the characteristics relating as the process of the production of the polyacetylene material are defined in the following description, with reference to the attached drawings.

DETAILED DESCRIPTION OF THE PREFERRED EMBODIMENTS

Figure 1:
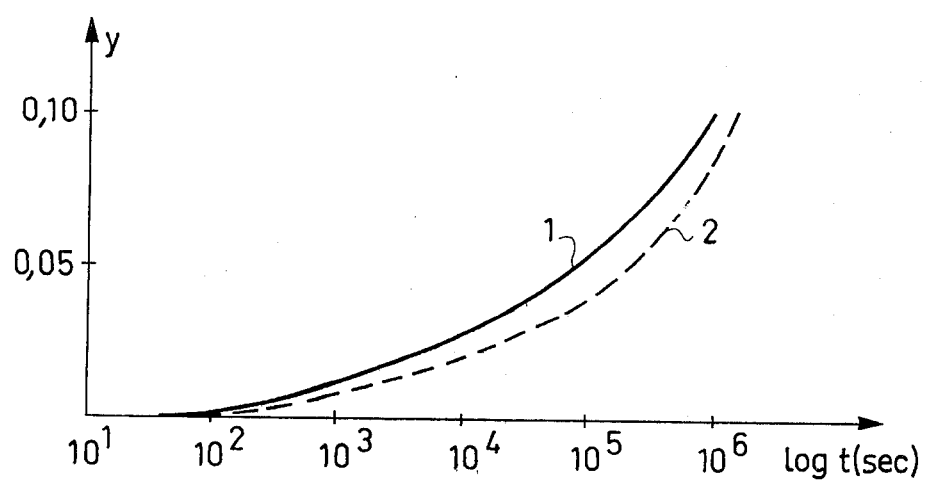
FIG. 1 shows the doping level as a function of the doping time in two embodiments of the invention.

In the following description, the conventional notation is used for the formulation of polyacetylene doped by a compound X:

$(CH\ X_y)_x$ in which y is the doping level or the concentration in moles of dopant.

Hereinafter will be described the preliminary stages of preparing the polyacetylene film:

(a) Two solutions of catalysts are prepared, e.g. tetrabutoxytitanium $(C_4H_9O)_4$ Ti on the one hand and triethylaluminium $(C_2H_5)_3$ Al on the other for forming by mixing, a polymerization initiator of the Ziegler-Natta type. The solvent can be toluene and the solution quantity is 0.006 to 0.1 mole/liter. The two solutions are successively introduced into the flask of a reactor having means for producing a vacuum. Degassing takes place by pumping after each liquid introduction.

(b) The mixture is left under a partial vacuum in the reactor, at ambient temperature, for at least 20 minutes. The mixture is then cooled to $-78°$ C. by placing the flask in a mixture of methanol and dry ice in the solid state. At a pressure between 30 and 700 mm of mercury, acetylene is introduced into the reactor. A polymer layer is then formed on the surface of the solution and its thickness depends on the pressure and admission time of the acetylene. This layer constitutes the polyacetylene film, which is degassed and washed at a temperature between $-78°$ C. and $0°$ C. using toluene or pentane until the washing solvent becomes colourless. The film is then dried under high vacuum and placed in a tube, which is sealed under vacuum.

The actual production stage involving doping of the sought material comprises the following secondary stages, using as an example the case of a chloride serving as the dopant, e.g. $W\ CL_6$ or $MoCl_5$.

(1) The dopant is placed under a vacuum in a flask directly connected to the tube containing the film and is then degassed under a secondary vacuum.

(2) The solvent, e.g. toluene is introduced by distillation into the flask containing the dopant, which is cooled to condense the toluene. The solvent volume is calculated as a function of the dopant weight so as to obtain a predetermined low concentration of, for example 0.1 g/l or less.

(3) The system, constituted by the flask containing the solution and the tube containing the film is then removed from the vacuum pump and the solution transferred by gravity into the tube containing the film.

(4) Doping is allowed to continue for a period of several days or roughly a week at ambient temperature. This time is necessary to obtain a uniform doping throughout the thickness of the polyacetylene film. To ensure uniform doping, the doping kinetics must be low and it is consequently necessary to operate at a low temperature and in a dilute solution of the doping substance. The doping level obtained is dependent on the doping concentration in the solvent, the solution quantity admitted into the tube containing the film being assumed as adequate.

(5) The doping solution is then transferred in the flask and the film is washed by successive pure solvent distillations in order to eliminate the excess dopant on the surface of the film. The film is then dried by pumping under vacuum.

(6) This is followed by drying the film by pumping under vacuum.

In FIG. 1, the logarithm of the doping time expressed in seconds is plotted on the abscissa and the doping level y of the polyacetylene $(CH\ X_y)_x$ is plotted on the ordinate. Curves 1 and 2 represent the variations of the level, respectively in the case of the dopant $W\ Cl_6$ and the dopant MoCl$_5$. It can be seen that several days (10$^5$ to 10$^6$ seconds) are necessary to bring the doping level above 0.05.

Figure 2:
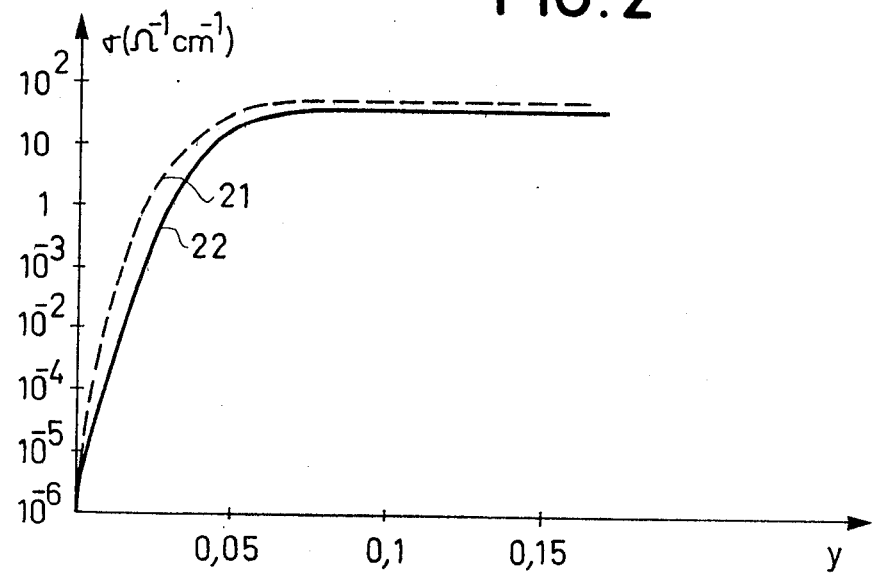
FIG. 2 shows the conductivities obtained as a function of the dopant quantity in the same embodiments.

In FIG. 2, the conductivity curve (in ohm$^{-1}$·cm$^{-1}$) is plotted as a function of the doping level. Curves 21 and 22 correspond to the respective cases of W Cl$_6$ and MoCl$_5$. It should be noted that the conductivity variation is very sensitive to the doping level between 0 and 0.05 and then becomes much less sensitive as from a value of 0.05 for the level and 10 ohm$^{-1}$·cm$^{-1}$ for the conductivity.

Figure 3:
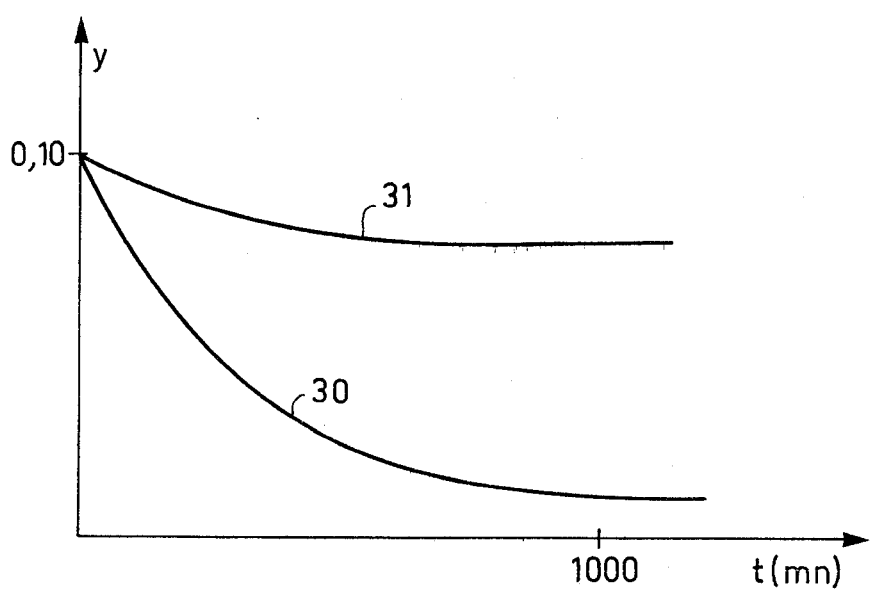
FIG. 3 shows a comparison of the time-based stability characteristics in the case of the invention and in the case of a conventional, prior art dopant.

FIG. 3 shows the decrease in the doping level at 120° C. and under vacuum, the time being given in minutes, in the case of MoCl$_5$ (curve 31) and iodine (curve 30), the latter case falling outside the scope of the invention. It can be seen that in the case of iodine a very considerable drop in the doping level takes place after a few hours with a stability at a very low level. However, in the case of the invention, the reduction is slight and stabilization takes place at a level of approximately 0.8.

As a function of its conductivity, the material according to the invention can either be used as an organic conductor, or as a type p semiconductor, either alone or in combination with a type n semiconductor. It is applicable to the construction of photodiodes and solar cells.

What is claimed is:

1. A conductive polyacetylene material with a high thermal stability and stability to oxygen, wherein said polyacetylene material is doped with a dopant constituted by a salt in chloride form of an element belonging either to the transition metals selected from the group consisting of chrome, nickel, iron, titanium, tungsten and molybdenum or to the lanthanides selected from the group consisting of europium and ytterbium.

2. The conductive polyacetylene material of claim 1, wherein the dopant is selected from the group consisting of WCl$_6$ and MoCl$_5$.

3. The conductive polyacetylene material of claim 1, having uniform doping.

4. The conductive polyacetylene material of claim 1, having a doping level above 0.05.

5. The conductive polyacetylene material of claim 1, having a conductivity of at least 10 ohm$^{-1}$·cm$^{-1}$.

6. The conductive polyacetylene material of claim 1, having a conductivity effective for use as a conductor selected from the group consisting of an organic conductor and a type p semiconductor.

7. The conductive polyacetylene material of claim 6, having a conductivity effective for use as a conductor, either alone or in combination with a type n semiconductor.

8. The conductive polyacetylene material of claim 1, having a degree of doping and a conductivity, effective for use in the construction of photodiodes or solar cells.

* * * * *